United States Patent
Fenigstein et al.

(10) Patent No.: US 10,852,399 B2
(45) Date of Patent: Dec. 1, 2020

(54) ACTIVE QUENCHING FOR SINGLE-PHOTON AVALANCHE DIODE USING ONE-SHOT CIRCUIT

(71) Applicant: Tower Semiconductor Ltd., Migdal Haemek (IL)

(72) Inventors: Amos Fenigstein, Haifa (IL); Dmitry Dain, Netanya (IL); Tomer Leitner, Nahariya (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 462 days.

(21) Appl. No.: 15/941,284

(22) Filed: Mar. 30, 2018

(65) Prior Publication Data

US 2019/0302242 A1    Oct. 3, 2019

(51) Int. Cl.
*G01S 7/4863* (2020.01)
*H01L 31/02* (2006.01)
(Continued)

(52) U.S. Cl.
CPC ............ *G01S 7/4863* (2013.01); *G01J 1/46* (2013.01); *G01S 7/484* (2013.01); *G01S 17/06* (2013.01); *H01L 31/02005* (2013.01); *H01L 31/02027* (2013.01); *H01L 31/107* (2013.01); *G01J 2001/4466* (2013.01)

(58) Field of Classification Search
None
See application file for complete search history.

(56) References Cited

U.S. PATENT DOCUMENTS

| | | | | |
|---|---|---|---|---|
| 4,303,861 A | * | 12/1981 | Ekstrom | H01L 31/02027 250/370.14 |
| 5,933,042 A | * | 8/1999 | Trottier | H03K 17/0416 327/326 |

(Continued)

OTHER PUBLICATIONS

Takai, Isamu et al., "Single-Photon Avalanche Diode with Enhanced NIR-Sensitivity for Automotive LIDAR Systems", Sensors 2016, 16, 459; doi:10.3390/s16040459, www.mdpi.com/journal/sensors, pp. 1-9.

*Primary Examiner* — Isam A Alsomiri
*Assistant Examiner* — Amir J Askarian
(74) *Attorney, Agent, or Firm* — Bever, Hoffman & Harms, LLP

(57) ABSTRACT

A sensor circuit having a Single Photon Avalanche Diode (SPAD) and an active quenching circuit including a quenching transistor controlled by a one-shot (or similar) circuit is disclosed. The quenching transistor applies a reverse-bias voltage level on the cathode of the SPAD. During photon detection events, pulses generated by the SPAD's avalanche breakdown trigger the one-shot circuit to de-actuate the quenching transistor, allowing the cathode potential to drop below the SPAD's breakdown voltage. After a delay period, which is defined by the one-shot's configuration, allows reliable completion of the avalanche breakdown process, the one-shot circuit re-actuates the quenching transistor such that the SPAD's cathode is refreshed to the reverse-bias voltage level. The one-shot circuit is optionally coupled by way of capacitors to the SPAD and the quenching transistor to facilitate implementation using standard CMOS elements. The sensor is suitable for use in a LIDAR system.

20 Claims, 7 Drawing Sheets

(51) Int. Cl.
*G01S 7/484* (2006.01)
*G01S 17/06* (2006.01)
*G01J 1/46* (2006.01)
*H01L 31/107* (2006.01)
*G01J 1/44* (2006.01)

(56) References Cited

U.S. PATENT DOCUMENTS

| | | | | |
|---|---|---|---|---|
| 6,541,752 B2* | 4/2003 | Zappa | .................. | G01J 1/44 |
| | | | | 250/214.1 |
| 6,940,589 B1* | 9/2005 | Suyama | .................. | G01J 1/44 |
| | | | | 250/214 VT |
| 7,897,906 B2* | 3/2011 | Deschamps | ............ | H03K 17/78 |
| | | | | 250/214 R |
| 9,178,100 B2 | 11/2015 | Webster et al. | | |
| 9,874,635 B1 | 1/2018 | Eichenholz et al. | | |
| 2014/0191115 A1* | 7/2014 | Webster | ............ | H01L 27/14609 |
| | | | | 250/214 R |

* cited by examiner

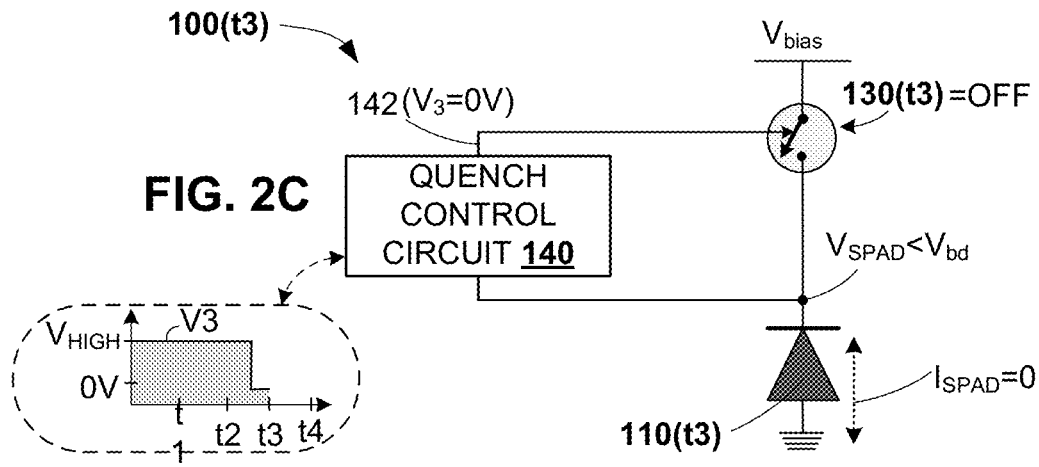
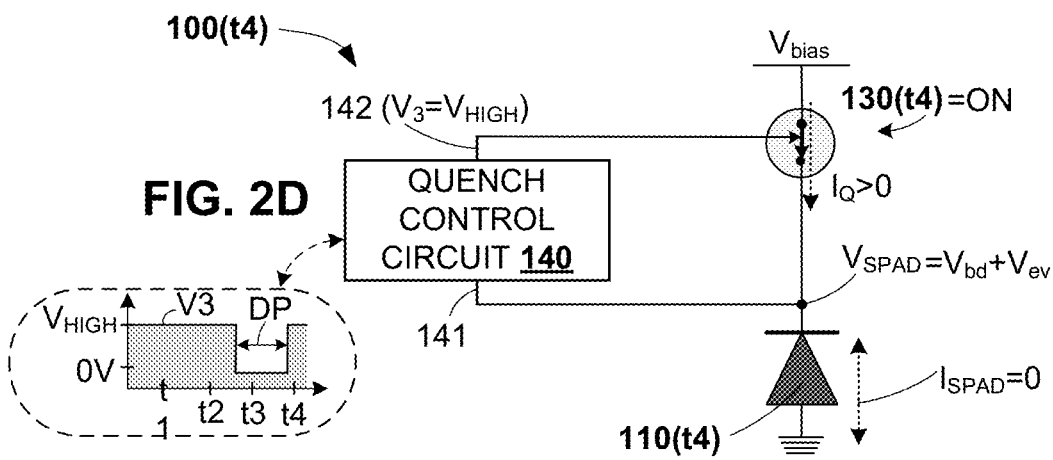
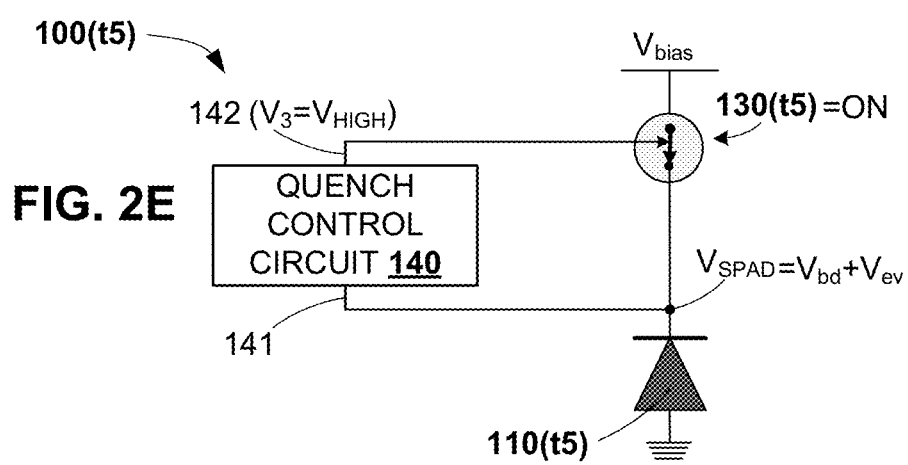

ACTIVE QUENCHING FOR SINGLE-PHOTON AVALANCHE DIODE USING ONE-SHOT CIRCUIT

FIELD OF THE INVENTION

This application relates to sensor circuits that utilize Single-Photon Avalanche Diodes (SPADs), and in particular to quenching circuits that provide rapid recovery of the SPADs after each photon detection event.

BACKGROUND OF THE INVENTION

Single-Photon Avalanche Diodes (SPADs) are solid-state photo detectors (photodiodes) capable of detecting incident photons. Most SPADs are currently fabricated using complementary metal-oxide-semiconductor (CMOS) processing techniques, which greatly facilitates their integration (i.e., on-chip incorporation) into single-photon detectors (SPDs) and other SPAD-based sensor devices that are currently utilized in many technical fields.

SPADs function in a manner similar to other avalanche photodiodes (APDs) in that they exploit the energy of incident radiation to trigger avalanche currents across a p-n junction. A fundamental difference between SPADs and APDs is that SPADs are specifically designed to operate with a reverse-bias voltage that is much greater (more positive) than the SPAD's breakdown voltage (i.e., in the so-called Geiger mode). That is, each SPAD is capable of remaining stable for a finite time after the reverse-bias voltage is applied at its cathode. When an incident photon with sufficient energy to liberate an electron enters a SPAD while the SPAD is in this reverse-biased state, the released photo-generated electron are accelerated by the high energy field in the depletion region of the p-n junction, thereby causing an avalanche breakdown (avalanche multiplication of electrons) event during which the SPAD breaks down (i.e., conducts a current generated by the reverse-bias potential). The avalanche breakdown event continues until the cathode potential falls below the SPAD's breakdown voltage, whereby the initial reverse-bias voltage is entirely discharged through the SPAD. The avalanche event produces a measurable current pulse that is detectable by a suitable detection sensor (e.g., a fast discriminator configured to sense the steep onset of the avalanche breakdown current across a 50Ω resistor, and to provide a digital output pulse synchronous with the incident photon arrival time), whereby incident photon arrival time at the location of the SPAD is registered and passed to downstream control circuitry for subsequent processing. The intensity of a photon signal is obtained by counting (photon counting) the number of output pulses generated by the SPAD within a measurement time slot, while the time-dependent waveform of the signal is obtained by measuring the time distribution of the output pulses (photon timing), which is obtained by operating the SPAD-based sensor (detector) in a Time Correlated Single Photon Counting (TCSPC) mode. Accordingly, the operation of SPADs in the Geiger mode provides an advantage over other APDs in that the current pulse generated during the avalanche breakdown event is generated by the SPAD's internal gain (i.e., by way of discharging the reverse-bias voltage), whereby SPADs are capable of functioning without the need for amplification of their detection (output) signal.

FIG. 7A shows a simplified example of a conventional "two-terminal" SPAD 40 based on an early configuration developed for incorporation into CMOS fabrication flows. SPAD 40 is disposed in a deep N-well 42 formed in a P-type substrate 41 that is isolated from other circuit elements (e.g., by shallow-trench isolation (STI) structures). SPAD 40 has central anode structure formed by a P+ (heavily P-doped) P-SPAD region 43 disposed over an N-type N-SPAD region 44, and an anode structure formed by a ring-shaped N+ (heavily N-doped) cathode contact region 45 formed over an N-Well region 46. Note that both P+ anode region 43 and N+ cathode contract region 45 are disposed near an upper surface 41U of substrate 41, and are accessed by way of metal contact structures 47 and 48, respectively. During operation, with cathode voltage $V_{CATHODE}$ set at a suitable reverse-bias voltage and anode voltage $V_{ANODE}$ coupled to ground, photons striking the diode create charge carriers, causing current to flow between the anode and the cathode, thereby initiating an associated avalanche breakdown event. SPAD 40 is referred to as a "two-terminal SPAD" because control circuitry can be connected to either the anode (i.e., P-SPAD 43) or the cathode (i.e., N+ cathode contract region 45)—that is, because both the anode and cathode of SPAD 40 are isolated from the bulk by way of being contained within deep N-well 42, the signals applied to both the anode and the cathode may be varied during operation without affecting neighboring circuit elements. However, this shallow configuration also causes SPAD 40 to have a relatively shallow depletion region, whereby the peak detection efficiency of two-terminal SPAD 40 is limited to blue light wavelengths. That is, on average, electromagnetic energy having wavelength is absorbed at different depths in silicon, with blue light (i.e., having a relatively high frequency, high energy, and short wavelength) being absorbed close to the silicon surface (e.g., to a maximum depth D1 below surface 41U in FIG. 7A), and red/near infra-red (NIR) light (i.e., having a relatively low frequency, low energy, and long wavelength) is absorbed deeper below the silicon surface. In other words, it is more probable that a red photon will be absorbed (generate an electron) deeper below the silicon surface than a blue photon. Accordingly, because the depletion region of two-terminal SPAD 40 is limited to relatively shallow depth D1, two-terminal SPAD 40 is only sensitive to relatively short (e.g., blue) light wavelengths, and cannot be used for detecting red and NIR photons.

More recently, SPADs exhibiting improved sensitivity to red and NIR wavelengths have been achieved using general CMOS technology by way of utilizing wells and implants to create relatively deep avalanche breakdown regions. FIG. 7B shows an exemplary enhanced-NIR-sensitive SPAD 50 including a central cathode region and a peripheral anode region, both formed in a P-type substrate 51. The central cathode region includes N+ cathode contact diffusions 52 formed over an N-Well (N-SPAD) region 53, which in turn is formed over a P-SPAD region 54. The ring-shaped anode structure is formed around the central cathode region, and includes P+ cathode contact diffusions 55 formed in a P-well region 56, which in turn is formed over a deep P-well 57. Note that the anode of SPAD 50 is not isolated from the bulk (i.e., both the anode and cathode are formed in P-type substrate 51). A benefit of this configuration is that the effective depth of the depletion region extends significantly deeper into substrate 51 than is possible using the two-terminal SPAD approach described above with reference to FIG. 7A, which facilitates enhanced sensitivity to red and NIR photons. However, a downside to this configuration is that it restricts control operations of SPAD 50 to cathode voltage $V_{CATHODE}$ (i.e., anode voltage $V_{ANODE}$ must be continuously maintained at system ground (0V) in order to prevent negatively affecting the operations of adjacent circuit elements). SPADs of the type shown in FIG. 7B are characterized herein as single-ended or one-terminal SPADs because they are typically fabricated with their anode terminal disposed in a p-substrate, and thus common to the rest of the system chip (i.e., the anode is necessarily connected to system ground), whereby quenching control of a single-ended SPAD is only possible by way of connection to the SPAD's cathode terminal. Other single-ended SPAD configurations are taught, for example, in U.S. Pat. No. 9,178,100, entitled SINGLE PHOTON AVALANCHE DIODE FOR CMOS CIRCUITS, which is incorporated herein by reference in its entirety. Another enhanced-NIR-sensitive SPAD of this type is disclosed in "Single-Photon Avalanche Diode with Enhanced NIR-Sensitivity for Automotive LIDAR Systems", I. Takai et al. (Sensors 2016, 16, 459; doi:10.3390/s16040459).

A downside to operating all SPADs in the Geiger mode is that a quenching mechanism (circuit) is required to stop the avalanche breakdown process. That is, as mentioned, each avalanche breakdown process continues until the voltage across the SPAD drops below the SPAD's breakdown voltage (e.g., with the SPAD's anode connected to 0V (ground), the avalanche breakdown process continues until the cathode voltage drops below the SPAD's breakdown voltage). A quenching circuit is coupled to each SPAD and functions to stop the avalanche breakdown process by operably impeding or preventing current flow to the SPAD's such that voltage across the SPAD reliably drops below the SPAD's breakdown voltage during each avalanche breakdown voltage.

FIGS. 8A-8D depict the most basic quenching mechanism for a SPAD, which is commonly known as standard passive quenching or passive quenching passive reset (PQPR), and involves utilizing a large resistor R (e.g., 100 kΩ or more) connected in series with a SPAD between a reset voltage $V_{RESET}$ and ground. In the stable reset state indicated in FIG. 8A, a potential $V_{SPAD}$ across the SPAD is at the reset voltage level $V_{RESET}$ (i.e., greater than the SPAD's breakdown voltage), and zero current $I_{SPAD}$ flows through the SPAD. As indicated in FIG. 8B, when an incident photon P enters the SPAD and initiates a breakdown event, a positive current $I_{SPAD}$ is generated that causes a positive current $I_{SPAD}$ to flow through the SPAD, thereby causing potential $V_{SPAD}$ across the SPAD to quickly drop from the reset voltage $V_{RESET}$ toward the SPAD's breakdown voltage $V_{bd}$. The decreasing potential $V_{SPAD}$ produces a voltage drop across resistor R that generates a positive current $I_R$, but resistor R is selected such that current $I_{SPAD}$ is much greater than current $I_R$ so that potential $V_{SPAD}$ is able to drop below the SPAD's breakdown voltage. The decrease of potential $V_{SPAD}$ from the reset voltage $V_{RESET}$ is also transmitted to a detection sensor or other measurement circuit for downstream processing. As indicated in FIG. 8C, the avalanche event in the SPAD stops when the potential $V_{SPAD}$ drops below the SPAD's breakdown voltage $V_{bd}$ (i.e., current $I_{SPAD}$ drops to zero) whereby the parasitic resistance of the SPAD starts to recharge by way of current $I_R$ passing through the resistor R. As indicated in FIG. 8D, this recharge process facilitated by current $I_R$ continues until the potential $V_{SPAD}$ is restored to reset voltage $V_{RESET}$, at which point current $I_R$ passing through the resistor R drops to zero, and the SPAD is reset to detect a subsequently arriving incident photon. A benefit of the passive quenching approach is that it is easily implemented, and facilitates passive (automatic) reset (recharge) of the SPAD (i.e., the reset process occurs automatically after each avalanche breakdown event, as contrasted with a scheduled/clocked reset that occurs whether an avalanche breakdown event has occurred or not.

Although passive quenching is relatively simple to implement and provides automatic reset of the SPAD, it limits SPAD reset (recharge) rates, and is thus not suited for high performance SPAD-based sensors that require rapid SPAD reset rates. Referring to FIGS. 8A-8D, the SPAD reset (recharge) process time period associated with the illustrated passive quenching example is determined by the RC time constant produced by the capacitance of the SPAD and the resistance of resistor R. This RC time constant is usually quite large due mainly to the large resistance of resistor R, which is required to allow potential VSPAD to drop below the SPAD's breakdown voltage $V_{bd}$ after each photon detection event. If a smaller resistor were utilized to reduce the SPAD reset process time period, then the SPAD may recharge too fast, which can produce a false (i.e., not triggered by photon) detection event immediately after the legitimate photon detection generated event. This false detection event occurs near the end of an avalanche breakdown event when the potential $V_{SPAD}$ drops below the SPADs breakdown voltage $V_{bd}$, but before the SPAD has stabilized, and is caused when the potential $V_{SPAD}$ recovers (rises) to the breakdown voltage level ($V_{bd}$) while electrons from the previous avalanche breakdown event are still present in the SPAD. This situation can arise when the resistor used in a passive quenching circuit is too small, and produces an "after-pulse" avalanche breakdown event that generates false detection signals.

A second quenching approach, known as active quenching, involves utilizing active circuitry to reset the bias voltage across a SPAD after a suitable "dead-time" period following each photon detection event, where the dead-time period's duration is set to avoid after-pulse events. One type of active quenching known as active quench active reset (AQAR) involves utilizing active circuitry (e.g., a fast discriminator) to detect the onset of photon-generated avalanche breakdown events, to quickly reduce the bias voltage across the SPAD to below the SPAD's breakdown voltage, and then to reset the bias voltage to above the breakdown voltage after the dead-time period. Another active quenching approach is known as active quenching passive reset (AQPR) utilizes active circuitry to quickly reduce the bias voltage across the SPAD to below the SPAD's breakdown voltage at the onset of a photon detection event, but reset of the bias voltage is performed in a manner similar to that used in the passive quenching approach described above. AQAR circuits often allow shorter dead-time periods, and significantly reduced variations between sequential dead-time periods, in comparison to AQPR circuits.

FIG. 9 depicts an exemplary SPAD-based sensor including an exemplary conventional active quenching circuit in which a SPAD's cathode is connected to a high voltage source VHV and the SPAD's anode is coupled to ground by way of an NMOS transistor, which functions as an active quench "resistor" under the control of a quench enable signal. A problem with this configuration is that it requires connection to the SPAD's anode in order to avoid the high SPAD operating voltages. As discussed above, this anode-connection requirement restricts use of this active quenching approach to two-terminals SPADs, which are discussed above with reference to FIG. 7A (i.e., this approach cannot be used with single-ended SPADs, such as those described above with reference to FIG. 7B). This restriction presents a problem in light detection and ranging (LIDAR) systems, which require SPAD-based sensors including enhanced-NIR-sensitive single-ended SPADs. That presents a significant problem because LIDAR systems are finding increasing use in automobile safety systems, where the single-ended SPADs are utilized to detect the presence of pedestrians or cyclists in the host automobile's path, whereby the LIDAR system is able to prompt (warn) the driver or initiate automatic evasive action (e.g., automatically brake the host automobile to avoid collision with the detected pedestrian/cyclist). Because it cannot be utilized with single-ended SPADs, the active quenching approach described with reference to FIG. 8 cannot be used in LIDAR systems.

US Pub. App. No. 20140191115A1 entitled "SPAD sensor Circuit with Biasing Circuit" discloses a quenching approach that utilizes a clock-controlled charge pump final stage circuit to periodically generate (refresh) the required reverse-bias voltage across a SPAD. The charge pump final stage circuit utilizes four transistors that are controlled by a clock signal to generate the reverse-bias voltage once during each clock cycle, and two capacitors to store and maintain the reverse-bias voltage on the SPAD. When the SPAD undergoes avalanche breakdown in response to an incident photon, the resulting voltage drop across the SPAD is detected, and then the charge pump final stage circuit subsequently refreshes the reverse-bias voltage. This approach may be utilized with single-ended SPADs, but implements a poorly defined dead-time period that can lead to erroneous detections because the reverse-bias voltage refresh rate is controlled by the clock signal, not the occurrence of photon detection events. That is, because the charge pump final stage circuit resets the reverse-bias voltage across the SPAD in accordance with the clock signal, the effective dead-time period following a given photon detection event and subsequent refresh varies depending on when the given photon detection event occurs during the clock cycle. For example, a relatively long dead-time period occurs when the given photon detection event occurs early in the clock cycle (e.g., right after a refresh event), whereby a relatively long time period passes before the next clock cycle produces a subsequent reverse-bias voltage refresh. Conversely, a relatively short dead-time period occurs when the given photon detection event occurs late in the clock cycle (e.g., right before the subsequent refresh event). The approach taught by US Pub. App. No. 20140191115A1 is therefore problematic because it can produce too-short dead-time periods that may result in undesirable after-pulse events.

What is needed is a quenching circuit for a SPAD-based sensor that combines the automatic-reset functionality of the passive quenching approach with the rapid reset functionality of an active quenching approach, and addresses the problems associated with conventional active quenching circuits mentioned above. What is particularly needed is a simple and reliable AQAR-type active quenching circuit for a SPAD-based sensor that is both configured for use with single-ended SPADs having enhanced NIR sensitivity and exhibits a consistent dead-time period.

SUMMARY OF THE INVENTION

The present invention is directed to an active quenching-recovery circuit for a SPAD-based sensor circuit that utilizes a quenching transistor and a quench control (e.g., one-shot) circuit to actively quench a SPAD for the duration of a delay (dead-time) period following each photon detection event, and to actively reset the SPAD at the end of the delay period for a subsequent photon detection event. The novel active quenching-recovery circuit is configured such that the quenching transistor is coupled between a bias voltage source and the cathode of the SPAD, such that the input terminal of the quench control circuit is coupled to the cathode of the SPAD, and such that the output terminal of the quench control circuit is coupled to a control (gate/base) terminal of the quenching transistor. With this arrangement the quench control circuit is able to actively perform quenching operations by way of receiving/detecting the characteristic pulses (triggering events) generated at the SPAD's cathode terminal that are caused by avalanche breakdown of the SPAD during photon detection events. According to an aspect of the invention, the quench control circuit is operably configured such that, in response to each triggering event, the quench control circuit turns off (de-actuates) the quenching transistor to isolate the SPAD's cathode from the bias voltage source to facilitate the quenching process, and then after a predetermined delay period during which the potential on the SPAD's cathode stabilizes at a (second) voltage that is below the SPAD's breakdown voltage, the quench control circuit turns on (re-actuates) the quenching transistor to re-couple the SPAD to the bias voltage source, whereby the SPAD is reset at the reverse-bias voltage level. The present invention thus provides several advantages over conventional quenching methods. First, the use of the quenching transistor facilitates active reset of the SPAD that is much faster in comparison than that provided by conventional passive quenching techniques, thus improving the time resolution of the SPAD. Second, the use of the quench control circuit to actively control the quenching transistor facilitates reliable generation of a well-controlled, predefined dead-time (delay) period between each trigger event and the reset operation, thereby providing the desired active-quench-active-reset (AQAR) control paradigm in which the SPAD is actively kept below its breakdown voltage (i.e., by de-coupling the SPAD from the bias voltage source) in order to prevent after-pulse events that can occur with conventional active quenching approaches, and then actively reset by way of re-actuating the quenching transistor. Another advantage is the quenching control circuit generates a shaped digital pulse that, by way of controlling the quenching transistor, functions to convert the voltage pulse generated by the SPAD into a digital (rectangle shaped) signal suitable for detection by downstream digital sensor circuitry.

According to a presently preferred embodiment, the quench control circuit of a novel active quenching circuit is implemented using a one-shot (e.g., a mono-stable multi-vibrator) circuit that is capacitively coupled to the SPAD's cathode by way of a first capacitor, and capacitively coupled to the gate terminal of an n-channel field-effect transistor (FET) by way of a second capacitor. An advantage of using a one-shot circuit to control the quench process is that one-shot circuits are simple, well-known circuits, and may be easily configured using known techniques to reliably provide a consistent dead-type period having any required duration without the need for an externally-supplied clock signal. By capacitively coupling the one-shot circuit to the SPAD in the manner described above, the one-shot circuit is isolated from the high voltages required to operate the SPAD such that it can be implemented using standard CMOS transistors that are configured to operate within a selected standard CMOS operating range (e.g., 0V to 3.3V, or 0V to 5V), thereby avoiding the need for generating the one-shot circuit using special high-voltage transistors. Note that the use of standard CMOS transistors is enabled by keeping the range of 0V to the "excess" bias voltage level (i.e., the voltage amount of the reverse-bias voltage that is above the SPAD's breakdown voltage level) within the selected standard CMOS voltage range. This configuration also facilitates forming the quenching transistor using an n-channel CMOS compatible (i.e., 3.3 Volt or 5 Volt) transistor. That is, during operation SPAD-based sensor circuit, voltage drops between the source, drain and gate of the quenching transistor are always within the range of 0V to the excess voltage level, which as set forth above is set below the CMOS system voltage (Vdd, e.g., 3.3 V or 5 V), whereby the only terminal of the quenching transistor that may experience a large voltage drop relative is the bulk node, which does not affect transistor performance or reliability. In a presently preferred embodiment, the quenching transistor is modified from the corresponding standard CMOS transistor of the underlying CMOS technology in a way that forms either a native transistor (e.g., by omitting the P-well used in the standard CMOS transistor), or by including an enhanced P-well in order to avoid breakdown at the source/P-well and drain/P-well junctions.

In an exemplary specific embodiment the one-shot (quench control) circuit is implemented using series-connected inverters that are respectively capacitively coupled to the SPAD's cathode and the control terminal of an n-channel quenching transistor by way of two (first and second) capacitors, whereby the delay period is set at least in part by the propagation time of a signal pulse through the series-connected inverters. To implement this embodiment, the output terminal of the second inverter is coupled to the bias voltage source by way of a first resistor, and the input terminal of the first inverter is coupled to a second voltage supply by way of a second resistor. Beyond the implementation of the basic concept of capacitively coupled one-shot circuit, this approach produces a bootstrapping effect that functions to improve control over the dead-time period duration. That is, the avalanche breakdown is quenched by turning off the quenching transistor (i.e., applying a 0V gate-to-source voltage), the circuit overshoots and pulls the gate forcing the gate-to-source potential below 0V, which ensures quenching of the SPAD during the entire dead-time period. At the end of the dead-time period the proposed circuitry momentarily boosts the gate-to-source potential above the required turn-on voltage, which facilitates higher conduction through the quenching transistor to reset the SPAD in a minimal amount of time.

According to a practical embodiment, a light detection and ranging (LIDAR) system is configured to utilize an enhanced-NIR-SPAD-based sensor circuit to detect NIR light reflected from an object located in the LIDAR system's field of view. An advantage of using the novel sensor circuit of the present invention is that the faster refresh (reset) rate of the novel active quenching circuit (i.e., in comparison to conventional active or passive quenching circuits) provides the LIDAR system with higher resolution, which is believed to enhance accuracy and operating safety.

BRIEF DESCRIPTION OF THE DRAWINGS

These and other features, aspects and advantages of the present invention will become better understood with reference to the following description, appended claims, and accompanying drawings, where:

FIGS. 2A, 2B, 2C, 2D and 2E are diagrams depicting the sensor circuit of FIG. 1 during operation according to another embodiment of the present invention;

DETAILED DESCRIPTION OF THE DRAWINGS

The present invention relates to an improvement in SPAD-based sensor circuits. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
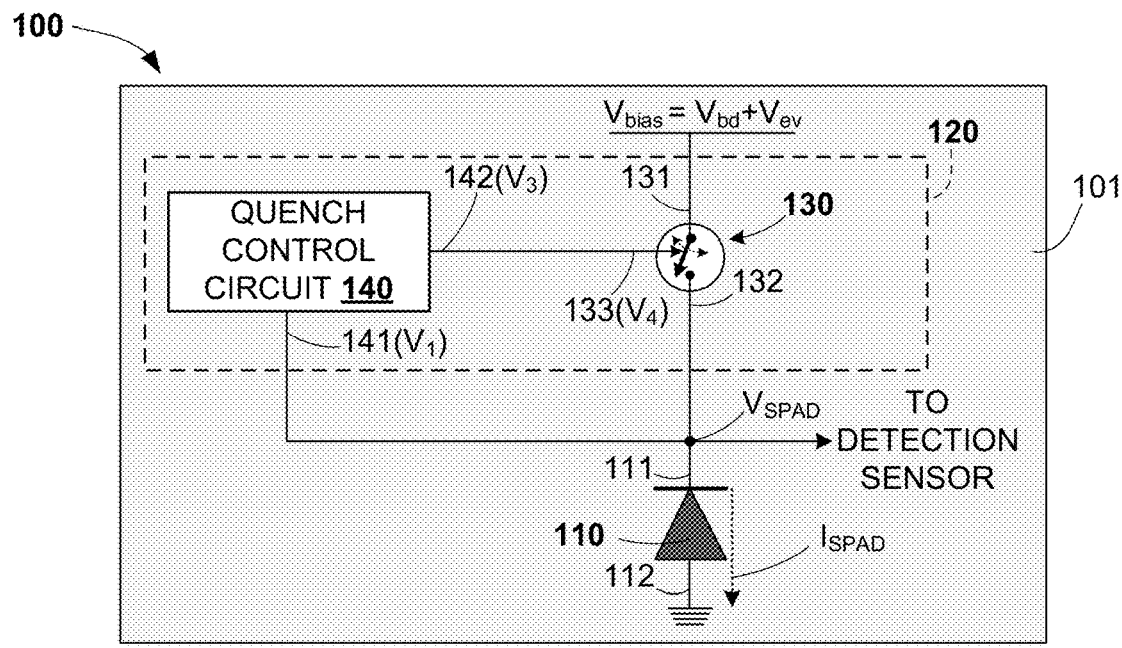
FIG. 1 is a simplified diagram showing a SPAD-based sensor circuit including an active quenching circuit according to a generalized embodiment of the present invention.

FIG. 1 shows a SPAD-based sensor circuit 100 is fabricated on a semiconductor substrate 101 and includes a SPAD 110 and an active quenching circuit 120 including a quenching transistor 130 and a quench control circuit 140. In a preferred embodiment, sensor circuit 100 is fabricated using CMOS processing techniques.

SPAD 110 includes a cathode terminal 111 coupled to a suitable detection sensor (not shown), and an anode 112 connected to ground (e.g., the substrate bulk or another fixed voltage source). Potential $V_{SPAD}$ is utilized herein to identify the reverse voltage level across SPAD 110 (i.e., the voltage level at cathode 111 relative to anode 112) at a given time during sensor operation. Consistent with conventional SPADs, SPAD 110 is configured to temporarily maintain/store a potential $V_{SPAD}$ on cathode terminal 111 at a reverse-bias (first) voltage level (i.e., $V_{SPAD}=V_{bd}+V_{ev}$) that is a predetermined amount (referred to herein as an "excess" bias voltage $V_{ev}$) greater than its breakdown voltage $V_{bd}$ in the absence of a triggering event (e.g., an incident photon), where the breakdown voltage ($V_{bd}$) is the minimum reverse voltage level of potential $V_{SPAD}$ at which SPAD 110 conducts in reverse (i.e., in the direction of arrow $I_{SPAD}$ shown in FIG. 1). In a preferred embodiment, SPAD 110 is a single-ended SPAD with enhanced NIR sensitivity, such as that disclosed in U.S. Pat. No. 9,178,100 (cited above), which is configured such that its breakdown voltage $V_{bd}$ is in the range of 10 V and 60 V, and such that it can temporarily maintain a reverse-bias voltage level $(V_{bd}+V_{ev})$ in the range of 1 V and 10 V. In one embodiment, bias voltage source $V_{bias}$ is configured to maintain a fixed potential equal to the reverse-bias voltage level $(V_{bd}+V_{ev})$ that can be temporarily maintained across SPAD 110, as described above.

Quenching transistor 130 includes a first terminal 131 connected to a bias voltage source $V_{bias}$, a second terminal 132 connected to cathode 111, and a control terminal 133 coupled to receive an output signal received from quench control circuit 140. Control terminal 133 controls the on/off operating state (i.e., conduction between first terminal 131 and second terminal 132) in accordance with an output signal received from quench control circuit 140. In a preferred embodiment, quenching transistor 130 is implemented by an n-channel MOSFET having a drain (first) terminal 131 connected to a bias voltage source $V_{bias}$, a source (second) terminal 132 connected to cathode 111, and a gate (control) terminal 133. The MOSFET is fabricated in accordance with the underlying CMOS technology (e.g., 3.3 V or 5.0 V), but is either implemented as a native transistor (e.g., by omitting the standard P-well utilized in "normal" n-channel MOSFETs of the underlying CMOS technology), or altered using a modified P-well that is configured to avoid breakdown at the source-to-P-well or drain-to-P-well junctions.

Quench control circuit 140 includes an input terminal 141 coupled to cathode 111 of SPAD 110 and an output terminal 142 coupled to control terminal 133 of quenching transistor 130, and is configured using known techniques to control the on/off state of quenching transistor 130 such that SPAD 110 is de-coupled (electrically isolated) from bias voltage source $V_{bias}$ for a dead-time (delay) period following each photon detection (triggering) event. The configuration of quench control circuit 140 is described functionally in conjunction with the exemplary operation of sensor circuit 100, which is described below with reference to FIGS. 2A to 2E. As set forth below, quench control circuit 140 is preferably implemented using a one-shot circuit, but those skilled in the art will recognize that the operation performed by quench control circuit 140 may be implemented using other circuit types as well.

FIGS. 2A to 2E depict the operation of sensor circuit 100 (FIG. 1) according to the generalized embodiment. The time-varying sequence of operating states is indicated using parenthetical suffixes t1 to t5, where suffix t1 (FIG. 2A) indicates an initial operating state of the associated circuitry, suffix t2 (FIG. 2B) indicates an associated operating state at a time subsequent to the initial operating state, etc. Note that the time duration between referenced times is not intended to be consistent (e.g., the duration between times t1 and t2 may be longer or shorter than the duration between times t2 and t3).

Figure 2A:
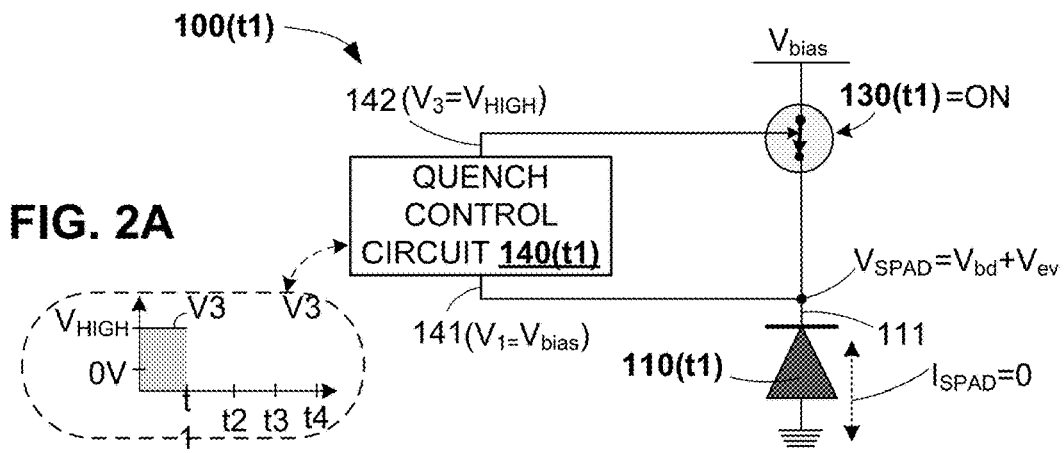

FIG. 2A depicts sensor circuit 100(t1) at an initial time when SPAD 110(t1) is reset (i.e., after potential $V_{SPAD}$ is set to reverse-bias voltage level $V_{bd}+V_{ev}$, and current $I_{SPAD}$ is equal to zero) and before a photo detection event). As indicated by the bubble shown in the lower left portion of FIG. 2A, an output signal $V_3$ generated at output terminal 142 of quench control circuit 140 is maintained high at time t1 such that quenching transistor 130(t1) remains actuated (closed or turned-on), whereby cathode terminal 111 is maintained at the reverse-bias voltage level by way of being coupled to bias voltage source $V_{bias}$.

Figure 2B:
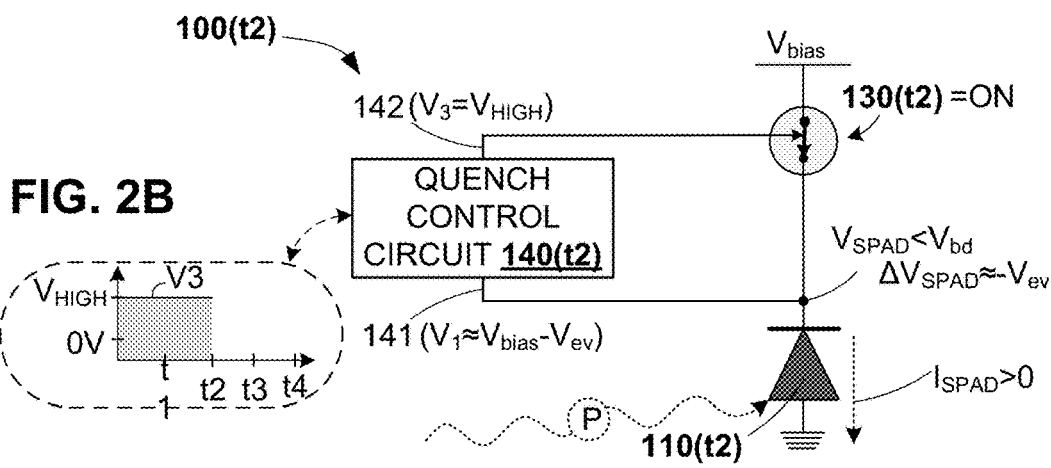

FIG. 2B depicts sensor circuit 100(t2) when an incident photon P enters SPAD 110(t2) and causes an avalanche breakdown event, thereby producing a positive current $I_{SPAD}$ through SPAD 110(t2) that causes potential $V_{SPAD}$ at cathode 111 to quickly decrease from the reverse-bias voltage level $(V_{bd}+V_{ev})$ to a (second) voltage level that is below the SPAD's breakdown voltage $V_{bd}$. The resulting rapid change in potential $V_{SPAD}$ ($\Delta V_{SPAD}$) which is approximately equal to excess bias voltage $V_{ev}$, produces a pulse that is transmitted to input terminal 141 of quench control circuit 140(t1). As indicated by the bubble shown in the lower left portion of FIG. 2B, quench control circuit 140 initially (but very briefly) maintains output voltage $V_3$ at output terminal 142 at the high voltage level as the low-going pulse propagates through quench control circuit 140, so quenching transistor 130(t2) remains turned on.

FIG. 2C depicts sensor circuit 100(t3) immediately after time t2, after the low-going pulse has propagated through quench control circuit 140(t2), and quench control circuit 140(t2) has responded by switching output voltage $V_3$ at output terminal 142 to a low voltage level (e.g., 0V), thereby de-actuating (turning off) quenching transistor 130, which effectively de-couples SPAD 110(t3) from bias voltage source $V_{bias}$. As indicated in the bubble at the lower left portion of FIG. 2C, quench control circuit 140 is configured to maintain its output terminal 142 at the low voltage state (e.g., $V_3$=0V) during a dead-time (delay) period following the trigger event, whereby quenching transistor 130(t3) will remains de-actuated (open or turned-off) for a period of time that is sufficient to allow potential $V_{SPAD}$ to stabilize below breakdown voltage $V_{bd}$, whereby the avalanche breakdown event in SPAD 110 is able to fully terminate (as indicated in FIG. 2C by current $I_{SPAD}$ through SPAD 110 being zero). The duration of the delay (dead-time) is determined by the configuration of SPAD 110 and other operating conditions of sensor circuit 100, and is fixedly set by way of configuring quench control circuit 140 using techniques such as those described in the specific examples provided below.

FIG. 2D depicts sensor circuit 100(t4) immediately after the dead-time period has elapsed. Quench control circuit 140 is further configured re-actuate quenching transistor 130 such that SPAD 110 is re-coupled to bias voltage source $V_{bias}$. Due to the relatively low voltage on cathode 111 at the end of the avalanche breakdown process, a quenching current $I_Q$ flows from bias voltage source $V_{bias}$ to cathode 111, whereby potential $V_{SPAD}$ on cathode 111 is reset to the desired reverse-bias voltage level $V_{bd}+V_{ev}$. As discussed above, SPADs are characterized by their ability to store/maintain reverse-bias voltage levels that are above the SPAD's breakdown voltage, and this characteristic is depicted in FIG. 2D by the zero current $I_{SPAD}$ passing through SPAD 110 during the resetting process. As indicated in the bubble at the lower portion of FIG. 2D, the delay (dead-time) period DP occurs between times t2 and t4, where output voltage $V_3$ is switched low at the beginning of the delay period and switched high at the end of the delay period.

FIG. 2E depicts sensor circuit 100(t5) immediately after SPAD 110(t5) has been reset to the desired reverse-bias voltage level $V_{bd}+V_{ev}$. Note that quench control circuit 140(t5) maintains output terminal 142 at the high voltage level (i.e., $V_3=V_{HIGH}$) such that quenching transistor 130(t5) remains turned on to couple SPAD 110(t5) to bias voltage source $V_{bias}$ until a subsequent triggering event.

As set forth in the description of FIGS. 2A to 2E (above), quenching circuit 120 is operably configured such that, during the delay period following each triggering (photon detection) event (i.e., between times t2 and t4, shown in FIG. 2D), quench control circuit 140 de-actuates (turns off) quenching transistor 130 to de-couple bias voltage source $V_{bias}$ from cathode terminal 111 of SPAD 110, thereby allowing SPAD 110 to complete the associated avalanche breakdown process, and then, after the predetermined dead-time period, re-actuates (turns on) quenching transistor 130 to restore potential $V_{SPAD}$ on cathode 111 to the desired bias (first) voltage level $V_{bd}+V_{ev}$ (e.g., as shown in FIG. 2E). An advantage provided by active quenching circuit 120 is that quenching transistor 130 facilitates rapid reset/recharging of SPAD 110 back to the desired reverse-bias voltage level $V_{bd}+V_{ev}$ much faster than is possible using a quenching resistor, thereby improving the time resolution of sensor circuit 100 over conventional passive quenching approaches. In addition, configuring quench control circuit 140 to generate a well-controlled predefined dead-time (delay) period (i.e., between time t2 (FIG. 2B) and time t4 (FIG. 2D)) facilitates reliable prevention of after-pulse events that can occur using conventional approaches.

Figure 3:
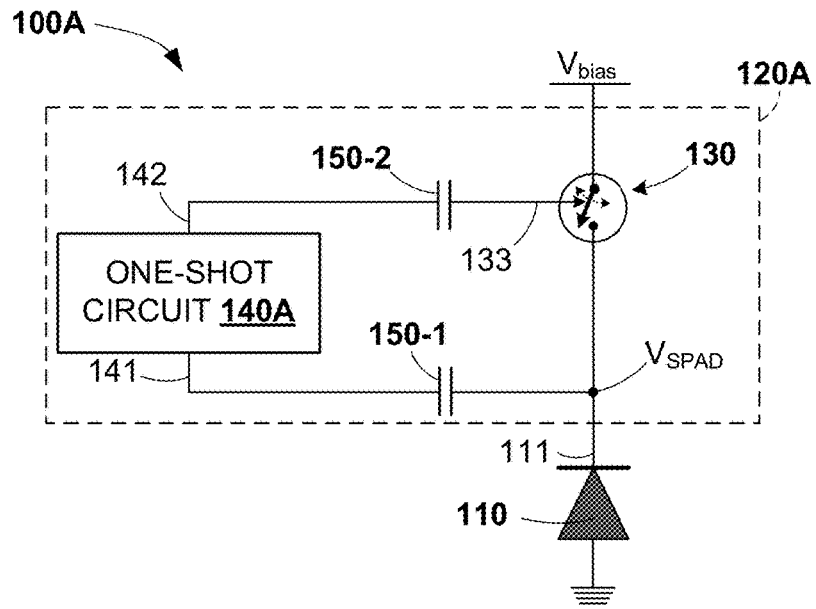
FIG. 3 is a simplified circuit diagram showing a SPAD-based sensor circuit according to a specific embodiment of the present invention.

FIG. 3 shows a SPAD-based sensor circuit 100A including a quenching circuit 120A according to a first specific embodiment of the present invention. Similar to sensor circuit 100 (FIG. 1), sensor circuit 100A includes a SPAD 110 that is coupled by way of a quenching transistor 130 to a bias voltage source $V_{bias}$, and quenching circuit 120A functions to control the on/off state of quenching transistor 130 in a manner consistent with the approach described above.

Sensor circuit 100A differs from sensor circuit 100 (FIG. 1) in that the quenching circuit is implemented using a one-shot (e.g., monostable multivibrator) circuit 140A. One-shot circuits are characterized by utilizing the time constant of an RC coupled circuit to switch from an unstable state to a stable state, thereby producing an output pulse when triggered by an external event. In this case, one-shot circuit 140A is configured to generate a high voltage signal on output terminal 132 when in its stable state, and to generate a low voltage output signal when in its unstable state. One-shot circuit 140A is further configured to switch from the stable state to the unstable state in response to the characteristic pulse generated at cathode 111 when SPAD 110 undergoes an avalanche breakdown (triggering) event, and to switch back to the stable state after a delay period corresponding to the predetermined dead-time period. An advantage of implementing the quench control circuit using one-shot circuit 140A is that one-shot circuits are highly reliable, and are configured using known methods to generate the required dead-time period having any desired duration without the need for an external clock signal.

Sensor circuit 100A also differs from sensor circuit 100 (FIG. 1) in that one-shot circuit 140A is capacitively coupled between cathode terminal 111 of SPAD 110 and control terminal 133 of quenching transistor 130 by way of capacitors 150-1 and 150-2. Specifically, (first) capacitor 150-1 is connected between cathode 111 and input terminal 141 of one-shot circuit 140, and (second) capacitor 150-2 is connected between output terminal 142 of one-shot circuit 140 and control terminal 133 of the quenching transistor 130. An advantage provided by capacitively coupling one-shot circuit 140 to SPAD 110 and quenching transistor 130 in this manner is that this arrangement serves to isolate one-shot circuit 140 from the non-standard (e.g., higher than standard CMOS) voltage levels typically required to operate conventional SPADs, thereby facilitating the fabrication of one-shot circuit 140 using standard CMOS components and voltage supplies, which both increases reliability, reduces overall circuit size, and reduces power consumption.

Figure 4:
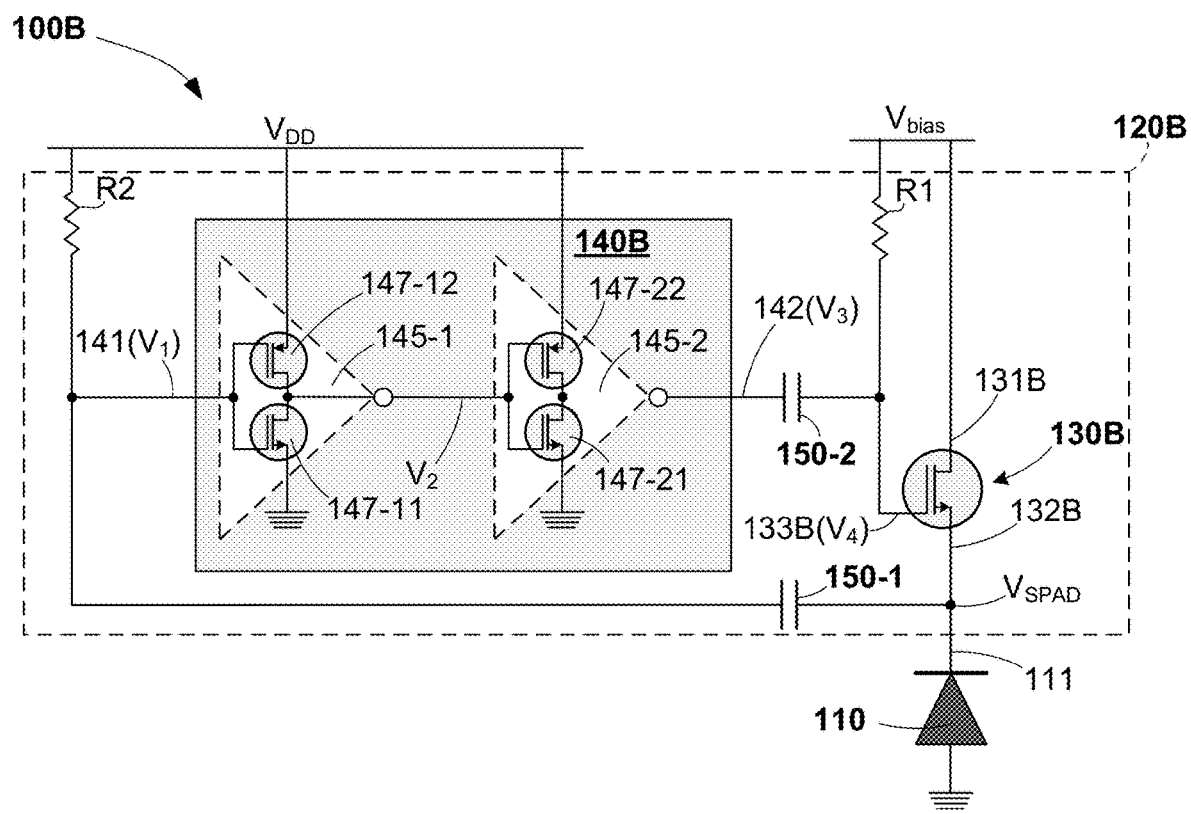
FIG. 4 is a simplified circuit diagram showing a SPAD-based sensor circuit according to another specific embodiment of the present invention.

FIG. 4 shows a SPAD-based sensor circuit 100B according to a second specific embodiment. Like the previous examples, sensor circuit 100B includes a SPAD 110 that is coupled by way of a quenching circuit 120B to bias voltage source $V_{bias}$, with quenching circuit 120B including an n-channel field effect transistor (FET) quenching transistor 130B that is controlled by a quench control circuit 140B.

Referring to the left side of FIG. 4, quench control (one-shot) circuit 140B is implemented in the present embodiment by a pair of series-connected inverters 145-1 and 145-2. An input terminal of (first) inverter 145-1 is capacitively coupled to cathode terminal 111 by way of a (first) capacitor 150-1, and an output terminal of (second) inverter 147-2 is capacitively coupled to control terminal 133B of n-channel quenching transistor 130B by way of a (second) capacitor 150-2. Like the previous embodiment, this specific quenching-recovery circuit configuration facilitates fabricating inverters 145-1 and 145-2 using standard CMOS transistors that are operated within a selected standard CMOS operating range (i.e., between 0V (ground) and a standard CMOS system voltage $V_{DD}$ such as 3.3 V or 5 V)), which avoids the need for generating one-shot circuit 140B using special high-voltage transistors. In the depicted specific embodiment, inverter 145-1 is formed by a standard CMOS n-channel transistor 147-11 and a standard CMOS p-channel transistor 147-12 connected in series between ground and system voltage $V_{DD}$ and controlled by voltage $V_1$ at input terminal 141, and inverter 145-2 is formed by a standard CMOS n-channel transistor 147-21 and a standard CMOS p-channel transistor 147-22 connected in series between ground and system voltage $V_{DD}$ and controlled by voltage $V_2$ generated by inverter 145-1. Note that the use of standard CMOS transistors 147-11 to 147-22 is enabled by configuring bias voltage source $V_{bias}$ to generate the reverse-bias voltage level such that excess bias voltage level $V_{ev}$ is within the standard CMOS voltage range (e.g., 0 V to 3.3 V, or 0 V to 5.0 V) of transistors 147-11 to 147-22.

SPAD-based sensor circuit 100B utilizes two resistors that further facilitate the use of standard CMOS transistors. That is, quenching circuit 120B includes a first pull-up resistor R1 that is connected between bias voltage source $V_{bias}$ and gate (control terminal) 133B of n-channel quenching transistor 130B, and one-shot circuit 140B includes a second pull-up resistor R2 connected between standard CMOS voltage source $V_{DD}$ and an input terminal of (first) inverter 145-1. Note that the connection of resistor R2 between voltage source $V_{DD}$ and input terminal 141 of one-shot circuit 140B is made possible by way of capacitor 150-1, and the length of the delay (dead-time) period is controlled by an RC time constant determined by a resistance of resistor R2 and a capacitance of capacitor 150-1.

Figure 5A:
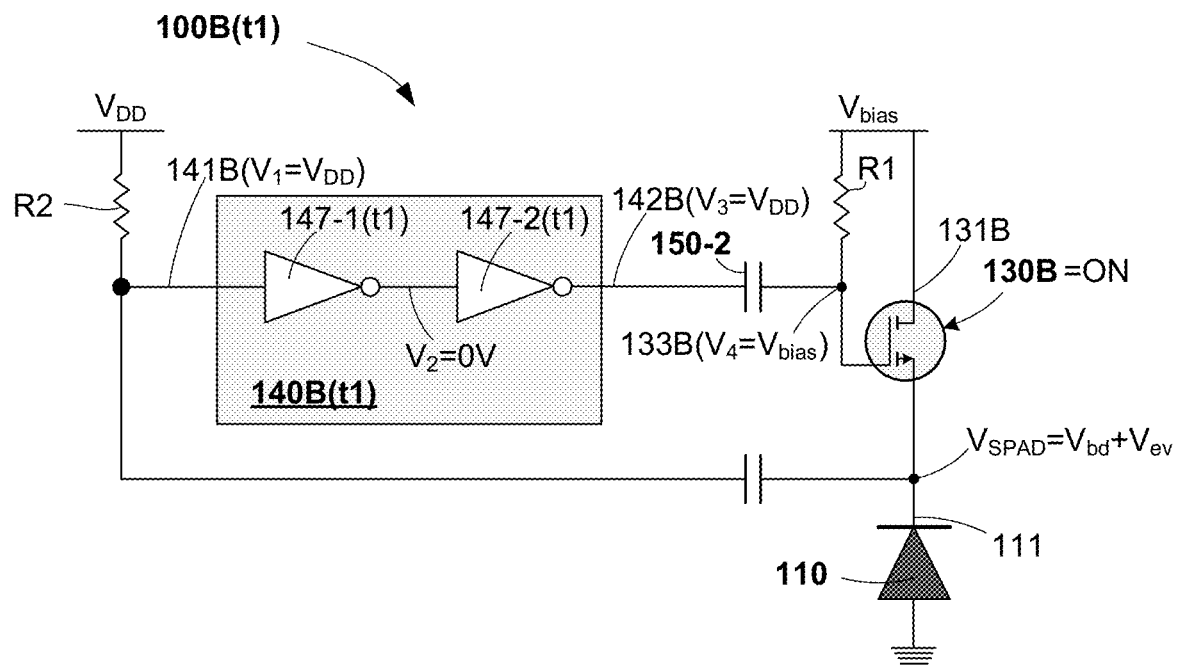
FIGS. 5A, 5B and 5C are diagrams depicting the sensor circuit of FIG. 4 during operation according to another embodiment of the present invention.
Figure 5B:
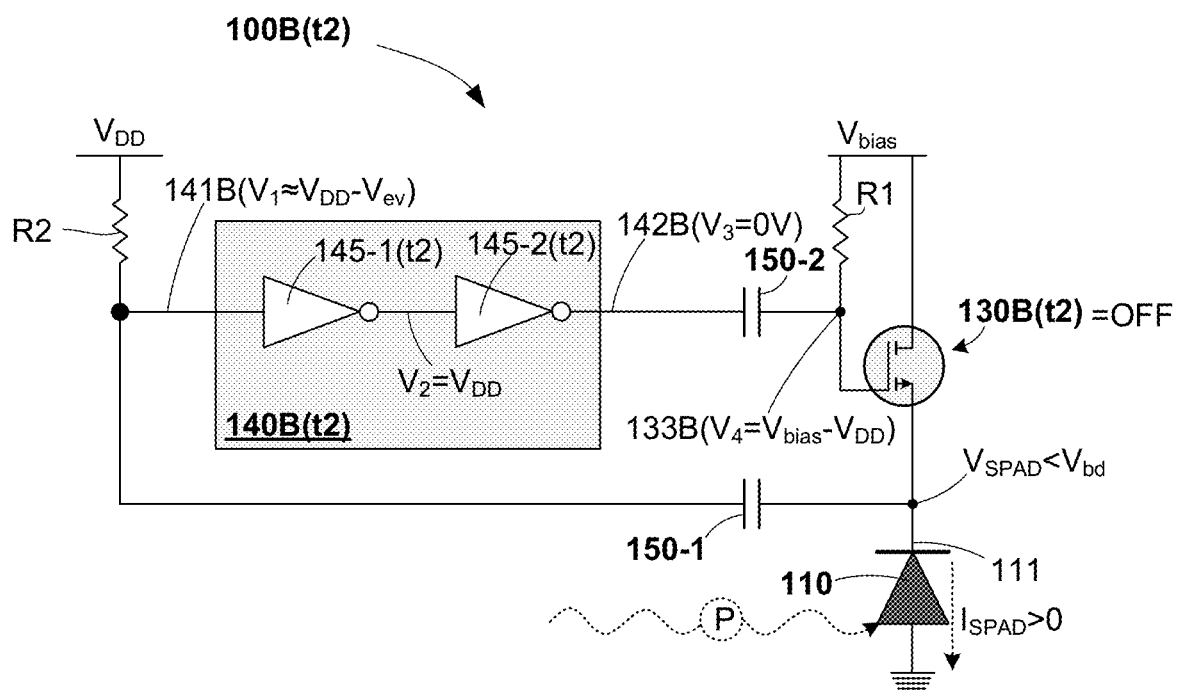
Figure 5C:
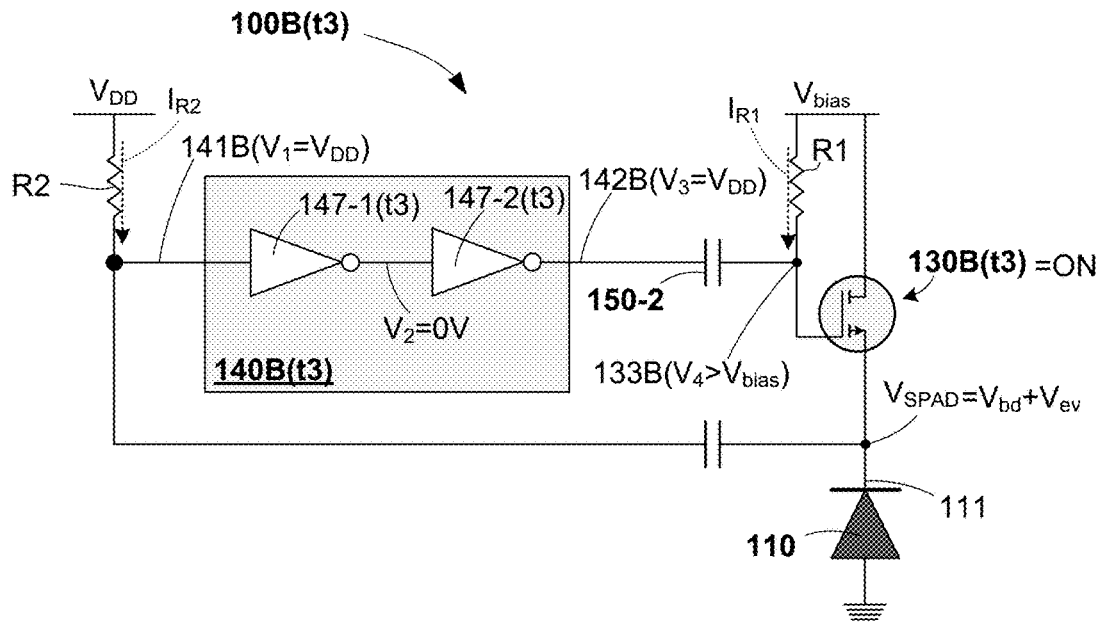

FIGS. 5A to 5C depict voltages and on/off states of the elements forming SPAD-based sensor circuit 100B during an exemplary triggering event.

FIG. 5A shows sensor circuit 100B(t1) just before the triggering event. As in the previous embodiments, SPAD 110 coupled to bias voltage source $V_{bias}$ by way of quenching transistor 130B, whereby potential $V_{SPAD}$ is maintained at the desired bias voltage $V_{bd}+V_{ev}$. Voltage $V_1$ at input terminal 141 of one-shot circuit 140B is maintained at $V_{DD}$ by way of pull-up resistor R2, whereby first inverter 145-1 generates output voltage $V_2$ at 0V, and whereby second inverter 145-2 generates output voltage $V_3$ at $V_{DD}$, which represents the output signal generated by one-shot circuit 140B. However, due to the presence of capacitor 150-2 and pull-up resistor 150-2, voltage $V_4$ at gate terminal 133B of quenching transistor 130B is maintained at bias voltage $V_{bias}$. Accordingly, potential $V_{SPAD}$ is maintained at the desired bias voltage $V_{bd}+V_{ev}$ by way of applying bias (first) voltage $V_{bias}$ to gate terminal 133B of n-channel MOSFET (quenching transistor) 130B.

FIG. 5B depicts sensor circuit 100(t2) when an incident photon P enters SPAD 110(t2) and causes an avalanche breakdown event, thereby producing a positive current $I_{SPAD}$ through SPAD 110(t2) that causes potential $V_{SPAD}$ at cathode 111 to quickly decrease from the bias voltage level ($V_{bd}+V_{ev}$) to a (second) voltage level that is below the SPAD's breakdown voltage $V_{bd}$. The resulting rapid change in potential $V_{SPAD}$ which is approximately equal to excess voltage $V_{ev}$, produces a pulse that is transmitted to input terminal 141 of one-shot circuit 140B(t1), whereby voltage $V_1$ decreases from $V_{DD}$ to approximately $V_{DD}-V_{ev}$. The decreased voltage $V_1$ causes inverter 145-1(t2) to switch output voltage $V_2$ from 0V to $V_{DD}$, which in turn causes inverter 145-2(t2) to switch output voltage $V_3$ from $V_{DD}$ to 0V. The decreasing pulse generated by output signal $V_3$ is transferred by way of capacitor 150-2 to gate terminal 133(t2), whereby voltage V4 is pulled down by an amount equal to VDD (i.e., $V_4=V_{bias}-V_{DD}$). This lower voltage $V_4$ keeps gate terminal 133B(t2) of n-channel MOSFET 130B below its source terminal 132B, which is was drawn down to approximately $V_{bv}$ by the avalanche breakdown process, thereby de-coupling SPAD 110(t2) from bias voltage source $V_{bias}$. This de-actuation of n-channel MOSFET 130B tolls the beginning of an intentional dead-time (delay) period during which SPAD 110 completes the avalanche breakdown process and potential $V_{SPAD}$ stabilizes at a level at or slightly below breakdown voltage $V_{bd}$.

FIG. 5C depicts sensor circuit 100(t3) at the end of the dead-time (delay) period. At this point current $I_{R2}$ through pull-up resistor R2 causes voltage $V_1$ at input terminal 141 to recover to voltage $V_{DD}$, and current $I_{R2}$ through pull-up resistor R1 causes voltage $V_4$ at gate terminal 133B of n-channel MOSFET 130B to recover nearly to voltage $V_{DD}$. At some point inverter 145-1(t3) is actuated (switched) in response to the increasing voltage $V_1$ such that voltage $V_2$ is switched back to 0V, and then inverter 145-2(t3) switches its output voltage $V_3$ from 0V to $V_{DD}$. The pulse generated by the positive-going output voltage $V_3$ at output terminal 141 of one-shot circuit 140(t3) is transferred through capacitor 150-2 to gate terminal 133B(t3) of n-channel MOSFET 130B, whereby voltage $V_4$ is rapidly increased by approximately $V_{DD}$, thereby re-actuating (turning on) n-channel MOSFET 130B such that SPAD 110(t3) is re-coupled to bias voltage source $V_{bias}$. The re-actuation of n-channel MOSFET 130B facilitates a fast recovery of potential $V_{SPAD}$ back to the desired bias voltage level (i.e., $V_{bv}+V_{ev}$). Configuring sensor circuit 100B such that standard CMOS voltage $V_{DD}$ is greater than excess voltage level $V_{ev}$ provides enhanced performance by way of providing a more reliable "off" state during the delay period (right after each triggering event) when gate voltage $V_4$ minus potential $V_{SPAD}$ equals excess voltage $V_{ev}$ minus standard CMOS voltage $V_{DD}$, and also provides a boost during the recovery process depicted in FIG. 5C as well.

Figure 6:
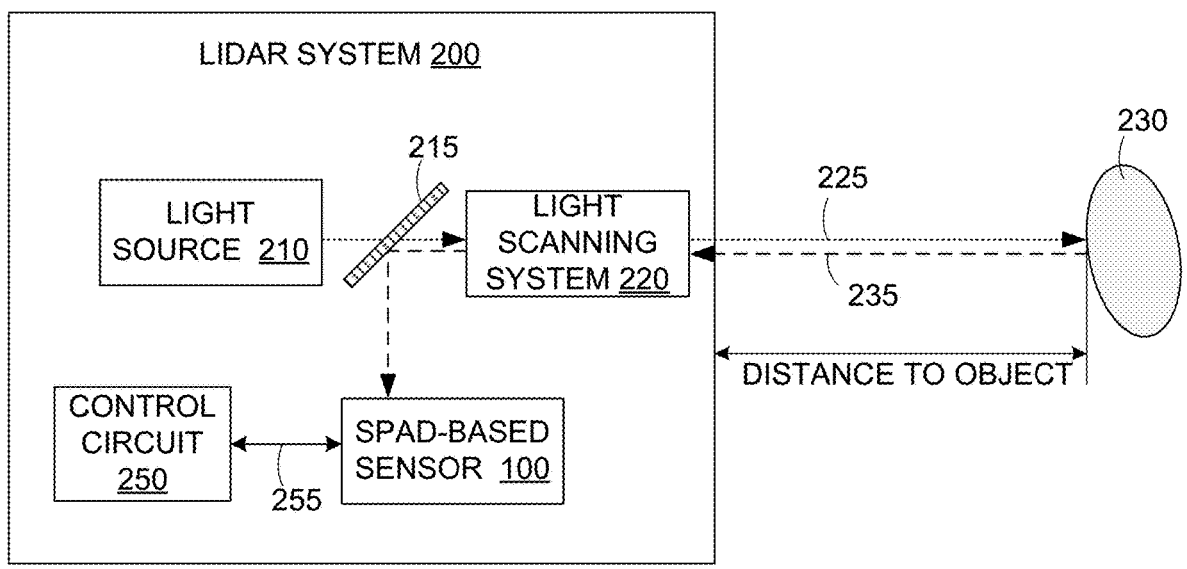
FIG. 6 is a simplified block diagram showing a light detection and ranging (LIDAR) system implementing a SPAD-based sensor circuit according to a practical embodiment of the present invention.
Figure 7A:
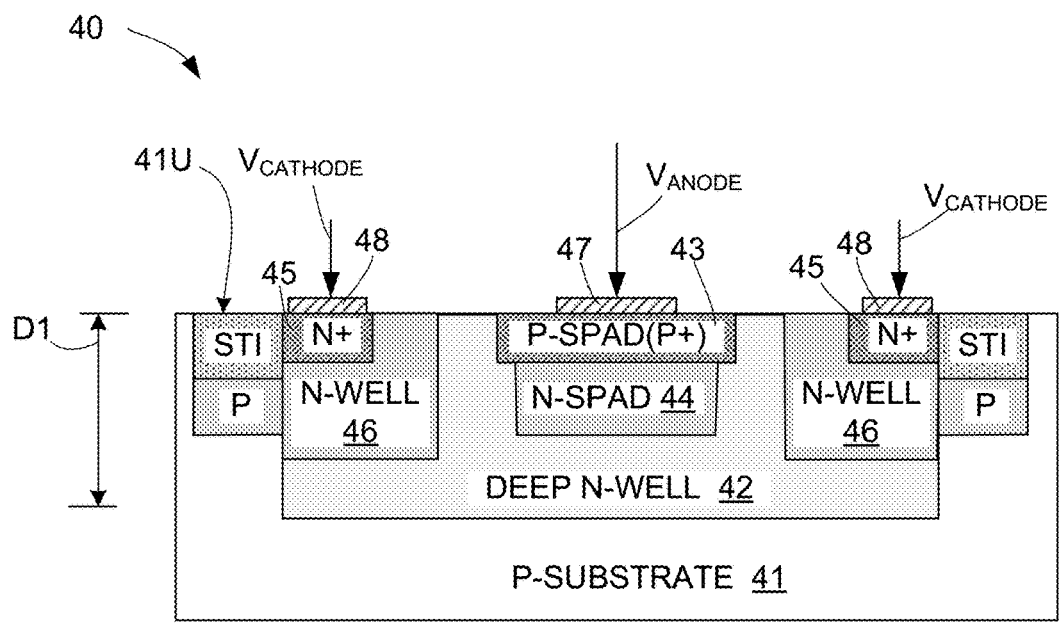
FIGS. 7A and 7B are cross-sectional side views showing conventional SPAD configurations.
Figure 7B:
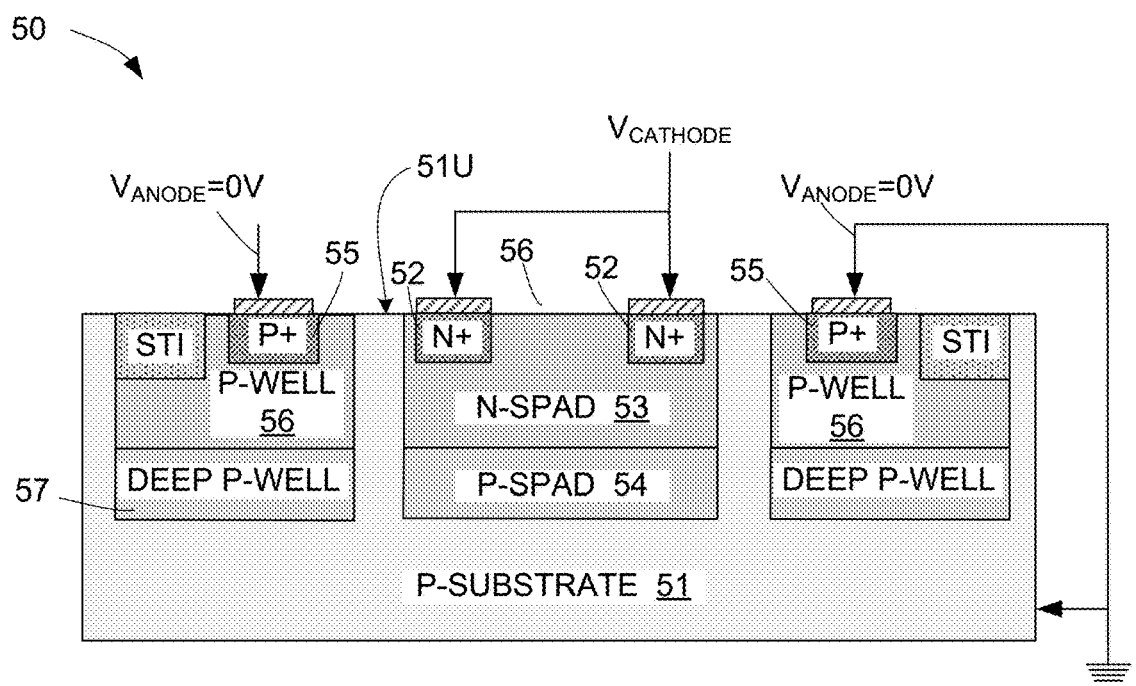
Figure 8A:
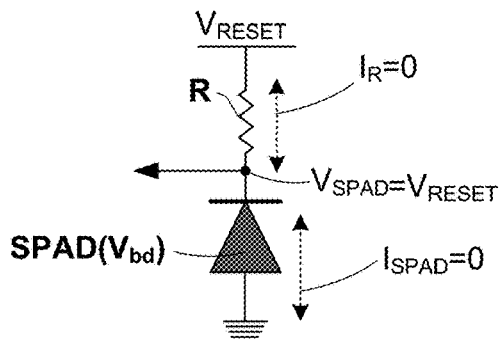
FIGS. 8A, 8B, 8C and 8D are diagrams depicting a conventional SPAD-based sensor implementing a passive quenching approach.
Figure 8B:
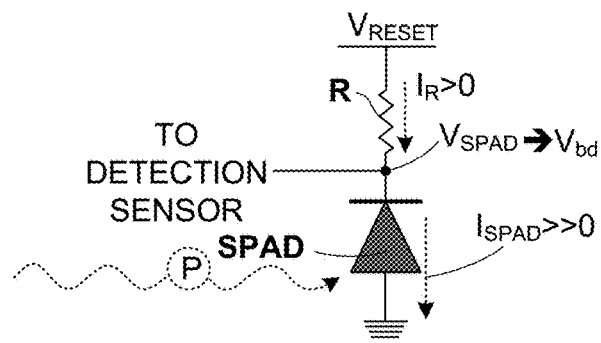
Figure 8C:
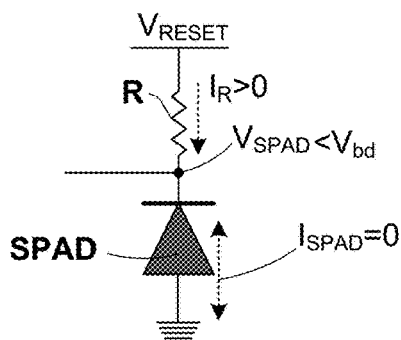
Figure 8D:
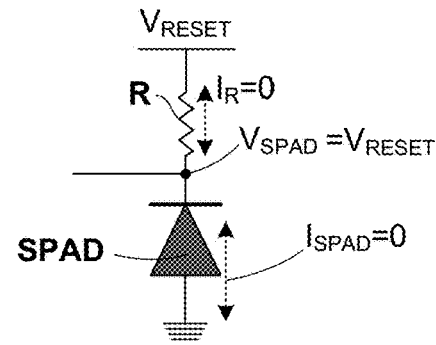
Figure 9:
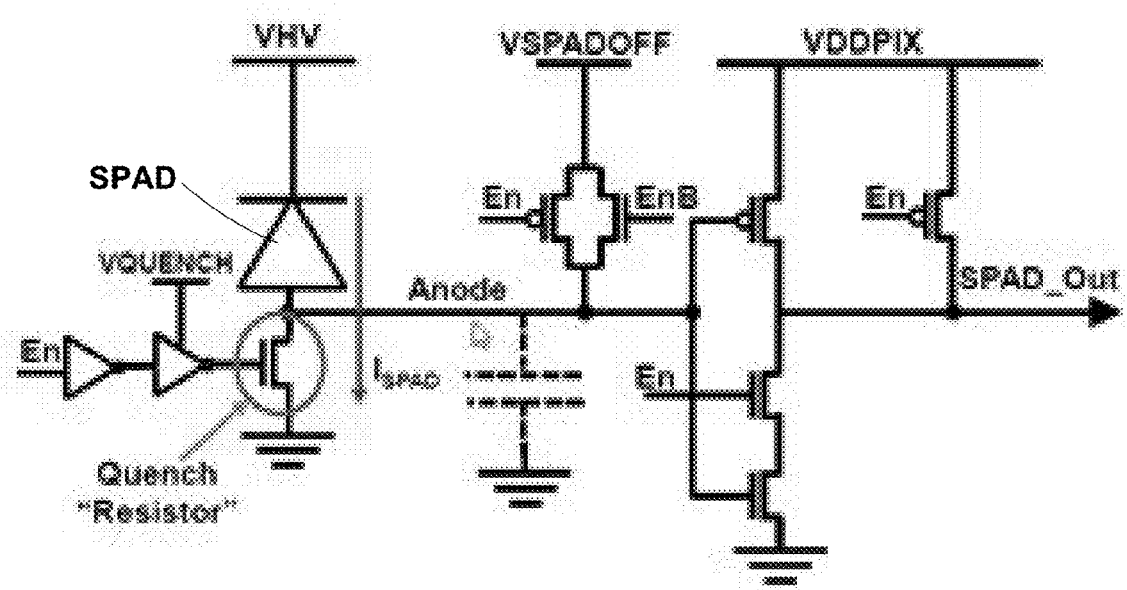
FIG. 9 is a diagram showing a conventional SPAD-based sensor implementing a conventional active quenching approach.

FIG. 6 is a simplified block diagram depicting a practical embodiment of the present invention in which any of the SPAD-based sensor circuits described above are incorporated into a light detection and ranging (LIDAR) system 200. LIDAR system 200 generally includes a light source 210, a mirror 215, a light scanning system 220, SPAD-based sensor circuit 100, and a control circuit 250. Light source 110 may be, for example, a laser that emits light having an operating wavelength in the infrared, visible, or ultraviolet portions of the electromagnetic spectrum, and preferably in the NIR spectrum (e.g., 850 nm). Light source 110 emits this NIR light as an output beam 225 that may be continuous-wave, pulsed, or modulated in any suitable manner for a given application. Output beam 225 is directed by way of light scanning system 220 into a light source field of view (e.g., toward a remote target 230 located a distance in the range of approximately 1 m to 1 km from LIDAR system 200). An input beam 235 is generated by portions of output beam 225 that are reflected or scattered from remote object 230 (or another structure in the light source field of view) back toward system 200. Input beam 235 is directed by way of light scanning system 220 and/or mirror 215 toward SPAD-based sensor circuit 100, which functions to detect photons forming input beam 235 in the manner set forth above. Control circuit 250 receives photon detection data from sensor 100 by way of a bus 255 and utilizes the photon detection data to implement one or more control procedures (e.g., in the case where LIDAR system 200 is utilized on an automobile, actuating an automatic braking system to prevent collision with object 230). One benefit of sensor circuit 100 in this practical embodiment is that the faster refresh (reset) rate achieved the novel active quenching circuit (i.e., in comparison to conventional active or passive quenching circuits) provides the LIDAR system with substantially more detection data, which is believed to enhance accuracy and operating safety of LIDAR system 200 over conventional LIDAR systems. Specifically, the short and well-defined dead-time provided by the one-shot-based quenching recovery configuration improves the performance of LIDAR system 200 in two ways: first, it prevents "after-pulse" avalanche breakdown events that generate false detection signals; and second, it resets the SPAD for detection of a subsequent photon in a shorter amount of time. These improved performance characteristics provide higher resolution (i.e., greater ability to detect objects and avoid "blind spots" in the LIDAR system's field of view), which is believed to enhance the accuracy and operating safety of LIDAR system 200.

Although the present invention has been described with respect to certain specific embodiments, it will be clear to those skilled in the art that the inventive features of the present invention are applicable to other embodiments as well, all of which are intended to fall within the scope of the present invention. For example, although the invention is described with particular reference to CMOS-based sensor circuits, the sensor circuits of the present invention may be implemented using other semiconductor fabrication technologies (e.g., silicon-on-insulator or BiCMOS). Moreover, the methodology implemented by the exemplary one-shot-based quenching circuits described herein may be implemented by other (i.e., non-one-shot) quench control circuit types, and therefore the appended claims are not restricted to one-shot circuits unless otherwise specified.

The invention claimed is:

1. A sensor circuit, comprising:
   a Single Photon Avalanche Diode (SPAD) having an anode and a cathode, said anode being connected to a fixed voltage source, the SPAD being configured to maintain a potential on the cathode at a first voltage level that is greater than a breakdown voltage of the SPAD in the absence of a triggering event, and configured to undergo avalanche breakdown when subjected to said triggering event until the potential drops from the first voltage to a second voltage below the breakdown voltage; and an active quenching circuit including:
- a quenching transistor having a first terminal connected to a bias voltage source and a second terminal connected to the cathode of the SPAD;
- a quench control circuit having an input terminal coupled to the cathode of the SPAD, and an output terminal coupled to a control terminal of the quenching transistor, wherein the quench control circuit is operably configured such that, in response to each said triggering event, said quench control circuit generates a first output signal that de-actuates said quenching transistor to isolate the SPAD from the bias voltage source, and then after a predetermined delay period during which the potential on the cathode stabilizes at the second voltage, the quench control circuit generates a second output signal that re-actuates said quenching transistor, whereby the SPAD is coupled to the bias voltage source such that potential on the cathode is restored to the first voltage level.

2. The sensor circuit according to claim 1, wherein the SPAD comprises a single-ended SPAD with enhanced NIR sensitivity.

3. The sensor circuit according to claim 1, wherein the active quenching circuit further comprises:
- a first capacitor connected between the cathode of the SPAD and the input terminal of the quench control circuit; and
- a second capacitor connected between the output terminal of the quench control circuit and the control terminal of the quenching transistor.

4. The sensor circuit according to claim 3, wherein the quench control circuit comprises a one-shot circuit.

5. The sensor circuit according to claim 4, wherein the one-shot circuit comprises a plurality of CMOS transistors configured to operate within a range of 0V to 5V.

6. The sensor circuit according to claim 3, wherein the quenching transistor comprises and n-channel field-effect transistor having a drain terminal connected to the bias voltage source, a source terminal connected to the cathode of the SPAD, and a gate terminal connected to the second capacitor.

7. The sensor circuit according to claim 6, wherein the quench control circuit comprises a first inverter and a second inverter connected in series between the first capacitor and the second capacitor.

8. The sensor circuit according to claim 7, wherein the active quenching circuit further comprises:
- a first resistor connected between the bias voltage source and the control terminal of the quenching transistor; and
- a second resistor connected between a second voltage source and an input terminal of the first inverter.

9. The sensor circuit according to claim 8, wherein each of the first inverter and the second inverter comprises at least one CMOS transistor configured to operate within a range of 0V to 5V.

10. A method for operating a Single Photon Avalanche Diode-based (SPAD-based) sensor circuit, the SPAD-based sensor circuit including at least one Single Photon Avalanche Diode (SPAD) having an anode and a cathode, the anode being connected to a fixed voltage source, the SPAD being configured to maintain a potential on the cathode at a first voltage level that is greater than a breakdown voltage of the SPAD in the absence of a triggering event, and configured to undergo avalanche breakdown when subjected to said triggering event until the potential on the cathode drops from the first voltage level to a second voltage level that is less than the breakdown voltage, wherein the method comprises:

before each said triggering event, coupling the SPAD to a bias voltage source by actuating a quenching transistor such that the potential on the cathode is maintained at the first voltage level;

during each said triggering event:
- de-coupling the SPAD from the bias voltage source by de-actuating the quenching transistor until the potential on the cathode of the SPAD stabilizes at the second voltage level; and then
- re-coupling the SPAD to the bias voltage source after a fixed delay period by re-actuating the quenching transistor such that the potential on the cathode of the SPAD is reset to the first voltage level.

11. The method of claim 10, wherein coupling the SPAD to the bias voltage source comprises applying a first voltage to a gate terminal of an n-channel MOSFET.

12. The method of claim 10,
wherein said de-coupling comprises utilizing a one-shot circuit coupled between the cathode of the SPAD and a control terminal of the quenching transistor to de-actuate the quenching transistor in response to a decrease of said potential on the cathode from the first voltage level to the second voltage level at an associated trigger event time, and wherein said re-coupling comprises utilizing said one-shot circuit to re-actuate the quenching transistor after said delay period has elapsed following the associated trigger event time, wherein a duration of the delay period is fixedly set by a configuration of the quenching circuit.

13. The method of claim 11, wherein utilizing said one-shot circuit comprises coupling an input terminal of said one-shot circuit to said cathode of the SPAD by way of a first capacitor, and coupling an output terminal of said one-shot circuit to said control terminal of the quenching transistor by way of a second capacitor.

14. A light detection and ranging (LIDAR) system comprising:
- a light source configured to emit pulses of near-infra-red (NIR) light as an output beam;
- means for scanning the output beam toward a light source field of view and for receiving reflected or scattered portions of the output beam as an input beam; and
- a sensor circuit configured to receive the input beam, wherein the sensor circuit comprises:
  - at least one enhanced-NIR Single Photon Avalanche Diode (SPAD) having an anode and a cathode, said anode being connected to a fixed voltage source, the SPAD being configured to maintain a potential on the cathode at a first voltage level that is greater than a breakdown voltage of the SPAD in the absence of a triggering event, and configured to undergo avalanche breakdown when subjected to said triggering event until the potential drops from the first voltage to a second voltage below the breakdown voltage; and
  - an active quenching circuit including:
    - a quenching transistor having a first terminal connected to a bias voltage source and a second terminal connected to the cathode of the SPAD;

a one-shot circuit having an input terminal coupled to the cathode of the SPAD, and an output terminal coupled to a control terminal of the quenching transistor, wherein the one-shot circuit is operably configured such that, in response to each said triggering event, said one-shot circuit generates a first output signal that de-actuates said quenching transistor to isolate the SPAD from the bias voltage source, and then after a predetermined delay period during which the potential on the cathode stabilizes at the second voltage, the one-shot circuit generates a second output signal that re-actuates said quenching transistor, whereby the SPAD is coupled to the bias voltage source such that potential on the cathode is restored to the first voltage level.

15. The LIDAR system according to claim 14, wherein said at least one SPAD comprises a single-ended SPAD with enhanced NIR sensitivity.

16. The LIDAR system according to claim 14, wherein the active quenching circuit further comprises:

a first capacitor connected between the cathode of the SPAD and the input terminal of the quench control circuit; and a second capacitor connected between the output terminal of the quench control circuit and the control terminal of the quenching transistor.

17. LIDAR system according to claim 16, wherein the quench control circuit comprises a one-shot circuit.

18. LIDAR system according to claim 16, wherein the one-shot circuit comprises a plurality of CMOS transistors configured to operate within a range of 0V to 5V.

19. LIDAR system according to claim 16, wherein the quenching transistor comprises and n-channel field-effect transistor having a drain terminal connected to the bias voltage source, a source terminal connected to the cathode of the SPAD, and a gate terminal connected to the second capacitor.

20. LIDAR system according to claim 19, wherein the quench control circuit comprises a first inverter and a second inverter connected in series between the first capacitor and the second capacitor.

* * * * *